US009934088B2

(12) United States Patent
Pangal et al.

(10) Patent No.: US 9,934,088 B2
(45) Date of Patent: *Apr. 3, 2018

(54) REDUCED UNCORRECTABLE MEMORY ERRORS

(71) Applicant: Intel Corporation, Santa Clara, CA (US)

(72) Inventors: Kiran Pangal, Fremont, CA (US); Prashant S. Damle, Santa Clara, CA (US); Rajesh Sundaram, Folsom, CA (US); Shekoufeh Qawami, El Dorado Hills, CA (US); Julie M. Walker, El Dorado Hills, CA (US); Doyle Rivers, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 245 days.

This patent is subject to a terminal disclaimer.

(21) Appl. No.: 14/844,843

(22) Filed: Sep. 3, 2015

(65) Prior Publication Data

US 2016/0188409 A1  Jun. 30, 2016

Related U.S. Application Data

(63) Continuation of application No. 13/792,597, filed on Mar. 11, 2013, now Pat. No. 9,136,873.

(51) Int. Cl.
*H03M 13/00* (2006.01)
*G06F 11/10* (2006.01)
(Continued)

(52) U.S. Cl.
CPC .......... *G06F 11/1076* (2013.01); *G06F 3/064* (2013.01); *G06F 3/0619* (2013.01);
(Continued)

(58) Field of Classification Search
CPC .. H03M 13/05; H03M 13/27; H03M 13/6508; G06F 11/1048
See application file for complete search history.

(56) References Cited

U.S. PATENT DOCUMENTS 9,136,873 B2 * 9/2015 Pangal ................ G06F 11/1048
2003/0167426 A1   9/2003 Slobodnik
(Continued)

FOREIGN PATENT DOCUMENTS

CN   104969193 A    10/2015
EP   1 125 294 B1    9/2002
(Continued)

OTHER PUBLICATIONS

Office Action received for Chinese Patent Application No. 201480008297.4, dated Apr. 19, 2016, 26 pages including 18 pages of English Translation.
(Continued)

*Primary Examiner* — Sam Rizk
(74) *Attorney, Agent, or Firm* — Compass IP Law PC

(57) ABSTRACT

Uncorrectable memory errors may be reduced by determining a logical array address for a set of memory arrays and transforming the logical array address to at least two unique array addresses based, at least in part, on logical locations of at least two memory arrays within the set of memory arrays. The at least two memory arrays are then accessed using the at least two unique array addresses, respectively.

30 Claims, 6 Drawing Sheets

(51) Int. Cl.
*H03M 13/05* (2006.01)
*H03M 13/27* (2006.01)
*G06F 3/06* (2006.01)
*H03M 13/15* (2006.01)
*H03M 13/19* (2006.01)

(52) U.S. Cl.
CPC ........ *G06F 3/0679* (2013.01); *G06F 11/1044* (2013.01); *G06F 11/1048* (2013.01); *G06F 11/1068* (2013.01); *H03M 13/05* (2013.01); *H03M 13/27* (2013.01); *H03M 13/6508* (2013.01); *H03M 13/152* (2013.01); *H03M 13/1515* (2013.01); *H03M 13/19* (2013.01)

(56) References Cited

U.S. PATENT DOCUMENTS

| | | |
|---|---|---|
| 2009/0164867 A1 | 6/2009 | Gray |
| 2011/0138254 A1 | 6/2011 | Yang |
| 2011/0154158 A1 | 6/2011 | Yurzola et al. |
| 2011/0209028 A1 | 8/2011 | Post et al. |
| 2012/0311406 A1 | 12/2012 | Ratnam et al. |
| 2014/0258804 A1 | 9/2014 | Pangal et al. |

FOREIGN PATENT DOCUMENTS

| | | |
|---|---|---|
| JP | 2004-139503 A | 5/2004 |
| JP | 2009-187214 A | 8/2009 |
| KR | 10-2015-0106916 A | 9/2015 |
| KR | 10-1693664 B1 | 1/2017 |
| WO | 2012/166723 A2 | 12/2012 |
| WO | 2014/164099 A1 | 10/2014 |

OTHER PUBLICATIONS

Notice of Allowance received for Korean Patent Application No. 10-2015-7021602, dated Sep. 29, 2016, 2 pages of Notice of Allowance and 7 pages of allowed claims in English.

Extended European Search Report received for European Patent Application No. 14779264.2, dated Oct. 24, 2016, 8 pages.

Letters of Patent received for Korean Patent Application No. 10-2015-7021602, dated Jan. 2, 2017, 3 pages including 1 page of English translation.

International Search Report and Written Opinion received for PCT Patent Application No. PCT/US2014020549, dated Jun. 25, 2014, 13 pages.

International Preliminary Report on Patentability received for PCT Patent Application No. PCT/US2014/020549, dated Sep. 24, 2015, 9 pages.

Office Action received for Japanese Patent Application No. 2016-500630, dated Aug. 9, 2016, 5 pages including 2 pages of English translation.

Office Action received for Korean Patent Application No. 10-2015-7021602, dated Mar. 16, 2016, 11 pages including 1 page of English translation.

* cited by examiner

REDUCED UNCORRECTABLE MEMORY ERRORS

CROSS-REFERENCE TO RELATED APPLICATIONS

The present application is a continuation of U.S. application Ser. No. 13/792,597 filed Mar. 11, 2013. Said application Ser. No. 13/792,597 is hereby incorporated by reference herein in its entirety.

BACKGROUND

The present subject matter relates to semiconductor memories, and more specifically, to reducing uncorrectable memory errors in semiconductor memories by organizing error correction codewords.

Many types of semiconductor memory are known. Some memory is volatile and will lose its contents if power is removed. Some memory is non-volatile and will hold the information stored in the memory even after power has been removed. One type of non-volatile memory is flash memory which stores charge in a charge storage region of a memory cell. Some flash memory cells store a single bit of information per cell, but it is becoming more and more common for a flash memory cell to store more than one bit of information by setting a threshold voltage of the cell to one of $2^n$ levels to store n bits of information.

Another type of memory is phase change memory (PCM). PCMs utilize a phase change material having a non-conductive amorphous state and a conductive crystalline state. A PCM cell may be put into one state or the other to indicate a stored value. By providing a potential across the PCM cell, the state of the PCM cell can be determined by measuring current flowing through the PCM cell. A PCM cell has a much higher on-current than off-current.

Some memory technologies are organized into cross-point arrays, where an array of memory cells are densely packed and are individually coupled to a unique pair of control lines. An individual memory cell is coupled to one row line that is oriented in one direction, such as a word line, and one column line that is oriented in a perpendicular direction, such as a bit line. Some memories may be organized as an array of cross-point arrays, where the individual cross-point arrays are very densely packed but may include some circuitry between the individual cross point arrays.

Some memory technologies may be sufficiently reliable that no error correction is necessary for many applications. In other technologies, the reliability of an individual memory cell may be low enough that an application of the memory may include redundant memory cells and error correction and/or detection information may be stored in the redundant memory cells. One common form of memory error correction is Hamming codes, where a set of parity bits is included that allow any single bit error in the codeword to be corrected. A Hamming code requires n+1 parity bits to protect $2^n$ bits, so 6 bits may be used to protect a 32 bit data word. Many other types of error correction codes are well known, including, but not limited to, Reed-Solomon codes and Bose-Chaudhuri-Hocquenghem (BCH) codes. Depending on the size of the page, or codeword, of data, the number of error correcting codes that are included, and the type of codes chosen, one or more errors may be correctable or simply detected within a codeword.

BRIEF DESCRIPTION OF THE DRAWINGS

The accompanying drawings, which are incorporated in and constitute part of the specification, illustrate various embodiments. Together with the general description, the drawings serve to explain various principles. In the drawings.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures and components have been described at a relatively high-level, without detail, in order to avoid unnecessarily obscuring aspects of the present concepts. A number of descriptive terms and phrases are used in describing the various embodiments of this disclosure. These descriptive terms and phrases are used to convey a generally agreed upon meaning to those skilled in the art unless a different definition is given in this specification. Reference now is made in detail to the examples illustrated in the accompanying drawings and discussed below.

Figure 1:
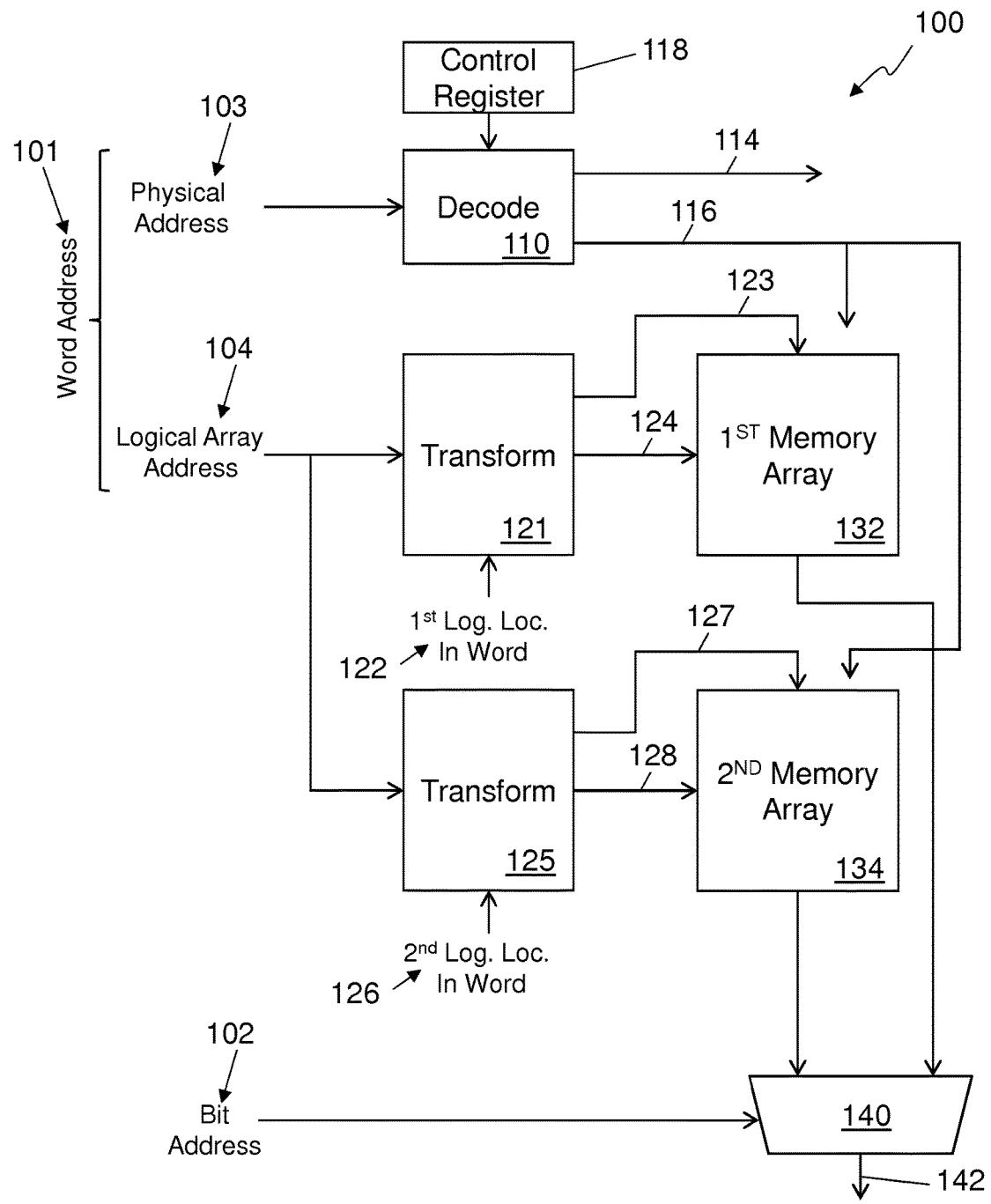
FIG. 1 shows block diagram of an embodiment to transform addresses to reduce uncorrectable errors in a memory.

FIG. 1 shows a block diagram of an embodiment to transform addresses to reduce uncorrectable errors in a memory. Circuitry 100 may receive an address for a memory access. Depending on the embodiment, the address may include a word address 101 to identify a word of data within the memory system, and a bit address 102 that may identify a bit of data within the word of data. If the data is accessed in an organization that is wider than a bit, the bit address 102 may identify a larger group of data, such as a byte, instead of an individual bit. A word of data, or a codeword, may include any number of data bits and any number of bits dedicated to error correction and/or detection. The word of data may be of any size, depending on the embodiment, and may depend on a type of error correction used. In some systems, a word of data may be spread across multiple memory devices. While any size of codeword may be used, in some embodiments a codeword of between about 1024 and about 4096 bits of data may be used. In some embodiments, an entire codeword of data may be simultaneously accessed, but in other embodiments, multiple memory accesses may be performed to access the entire codeword. In some embodiments, the codeword may include multiple bits of data within a single array of data that may not be accessed simultaneously. In some embodiments an array may be organized to allow multiple bits within the memory array to be accessed simultaneously, such as a row at a time.

A single memory device may include an array of memory arrays, and the codeword of data may be distributed across multiple memory arrays within one memory device. The word address 101 may include a physical address 103 that may address a set of memory arrays, and a logical array address 104 that may address a logical location within the individual memory arrays of the set of memory arrays. To illustrate a simplistic example, a memory device may have 4 memory arrays that each store 4 bits of information. Two bit words may be defined that include one bit of information from two different memory arrays. In that example, the physical address 103 would be a single bit long, to identify which set of two memory arrays is being addressed, and the logical array address 104 would be two bits to identify which location in the memory arrays is being accessed. The bit address 102, would be a single bit to identify which bit within the word is addressed, for a total of 4 bits to address the 16 bits of data that can be stored in the memory device.

The physical address 103 may be decoded by a decode circuit 110, that may determine which memory arrays to access based on the physical address 103. The decode circuit 110 may have outputs to enable the various memory arrays, such as a first enable line 114 and a second enable line 116. An individual enable line 114, 116, may enable a single memory array, or may enable more than one memory array, as shown.

In some embodiments, the mapping of the physical address 103 to sets of memory arrays may be fixed at design time, and may be based on a physical arrangement of the memory arrays within a memory device. In other embodiments, a control register 118, which may be programmed with configuration information, may be used to map the physical address 103 to a set of memory arrays. The control register 118 may be programmed with information based on error rates of the various memory arrays to distribute the memory arrays with higher error rates across multiple codewords to reduce the number of uncorrectable errors. In some embodiments, the control register 118 may be programmed during a manufacturing test process, before or after packaging. In some embodiments, the control register 118 may be programmed after the memory device has been integrated into an electronic system, such as during manufacturing of the system, or even during operation of the system. The control register 118 may be built with any type of storage technology, but in many embodiments, the control register 118 may be non-volatile so that the values programmed into the control register 118 can be maintained even if power is not applied. In some embodiments, the control register 118 may be one-time programmable, such as fuse links or anti-fuse links, but other embodiments, may use flash memory cells, PCM cells or any other type of non-volatile memory that may allow data to be written into the control register 118 more than once.

The logical array address 104 may be transformed into multiple different array addresses by transform circuitry. In the embodiment shown, a first transform circuit 121 uses a first logical location 122 within the codeword, to generate a first array address that includes a first column address 123 and a first row address 124. Depending on the embodiment, the first array address may be used to address one or more arrays that may contribute a bit of data to the codeword addressed. A second transform circuit 125 uses a second logical location 126 within the codeword, to generate a second array address that includes a second column address 127 and a second row address 128.

Depending on the embodiment, the column address, such as the first column address 123, and the row address, such as the first row address 124, may be a standard binary address bus allowing n address lines to identify a single column or row out of $2^n$ possibilities, or may be partially or fully decoded into more lines, such as one line per row or column. Depending on the embodiment, the separate array addresses may be used to address one or more arrays that may contribute a bit of data to the codeword addressed. So in some embodiments, the first column address 123 and the first row address 124 may be coupled to multiple memory arrays, including memory array 132, and the second column address 127 and the second row address 128 may be coupled to multiple memory arrays, including memory array 134. The data from the memory arrays accessed may be coupled to a multiplexor 140 that may select a single bit of data 142, or multiple bits of data for a particular access.

The logical location of the array(s) coupled to a common array address may be based on a physical arrangement of the different memory arrays within a set of memory arrays that contain data used in a codeword, an arbitrary assignment of different values for the different memory arrays within the set, and/or may be based on values programmed into a control register, depending on the embodiment. As an example, an embodiment may have a word that is 1024 bits in size with the bits of the word stored as one bit per memory array in 1024 different memory arrays. The memory arrays may be grouped as 64 groups of 16 memory arrays, with the 16 memory arrays of a single group coupled to a common array address. One transform circuit may be provided per group, so there may be 64 different transform circuits. The 64 different groups may be assigned a logical location ranging from 0 to 63 with the logical location for a group provided to the transform circuitry that generates the array address for that group. The assignment may be done in any manner, although some embodiments may distribute the logical locations so that there is no duplication of logical locations.

The transform circuitry 121 may transform the logical array address 104 to an array address based on the logical location, such as the first logical location 122. Any type of transformation may be used as long as there are no two valid logical array addresses 104 mapped to the same array address by a single transform circuit. One type of transformation that may be used in some embodiments is the re-ordering of address lines. In one embodiment, the array address may be obtained by a circular shift, or rotate, of the logical array address 104 by a number of locations based on the logical location 122. As an example of a transformation using a circular shift, if there are n lines in the logical array address, $L_i$, and the amount of shift performed by the transform circuit is m, which may be based on the logical location of the array(s), the array address, $A_i$, may be defined as:

$$A_i = L_{(i+m) \bmod n}$$

In another embodiment, the upper lines of the logical array address 104 may be rotated by a multiple of the logical location 122 to obtain the first column address 123, and the lower lines of the logical array address 104 may be rotated by a different multiple of the logical location 122 to obtain the first row address 124. In another embodiment, the lines of the logical array address 104 may be swapped in a different pseudo-random arrangement in the different transform circuits. In some embodiments, some address lines may not be re-ordered. Any arrangement of address line re-ordering may be used, as long as there are at least two different unique transforms performed to create at least two unique mappings of the logical array address 104 to array addresses.

Another type of transformation that may be used in some embodiments includes performing an arithmetic operation on the logical array address. In one embodiment, the array address may be obtained by adding a multiple of the logical location to the logical array address and discarding any additional upper bits that are generated. As an example of such a transform, the array address A may be calculated from the logical address L having n bits based on the logical location N where $0 \leq N \leq 2^n$, and M is an odd number that is constant across the various transform circuits by the equation:

$$A=(L+N \times M) \text{modulo } 2^n$$

Another example transformation may be represented by the equation:

$$A=(L \times (2N+1)+3M \text{ modulo } 2^n$$

Any other type of arithmetic operation may be performed as long as no two logical array addresses are mapped to a single array address by the same transform circuit.

Performing such a transform to the array addresses of the different arrays that may contribute data to a codeword may reduce uncorrectable errors. While some errors in a memory are located at random locations due to random manufacturing defects, some errors may be systemic. Systemic errors may be related to a memory cell's physical location within a memory array. Causes of such systemic errors may be based on a distance of a cell from the edge of the memory array where the line drivers and power connections are located, mask defects that may be repeated between memory arrays, or other systemic issues. Error correction codes have a limited number of errors that can be detected or corrected, depending on the embodiment. If a systemic error is based on a physical location of a cell within an array, a high percentage of the arrays may have a defective cell in that particular location. If no transformation of the address is performed, the same physical location of respective memory arrays in the set of memory arrays may be mapped to a common codeword, which may lead to a number of errors in the codeword that exceeds the number of bits that may be corrected, which may be referred to as overloading the codeword with errors. By distributing the physical locations of the bits of the codeword within the various memory arrays, the impact of a systemic error may be reduced, which may reduce the number of uncorrectable errors in the memory.

In some embodiments where a codeword is distributed across multiple memory devices, the logical location may include an identifier of the memory device so that memory arrays in the same physical location of different devices may receive different array addresses. By doing this, systemic defects related to a physical location of a memory array within an integrated circuit die may also be mitigated.

Figure 2:
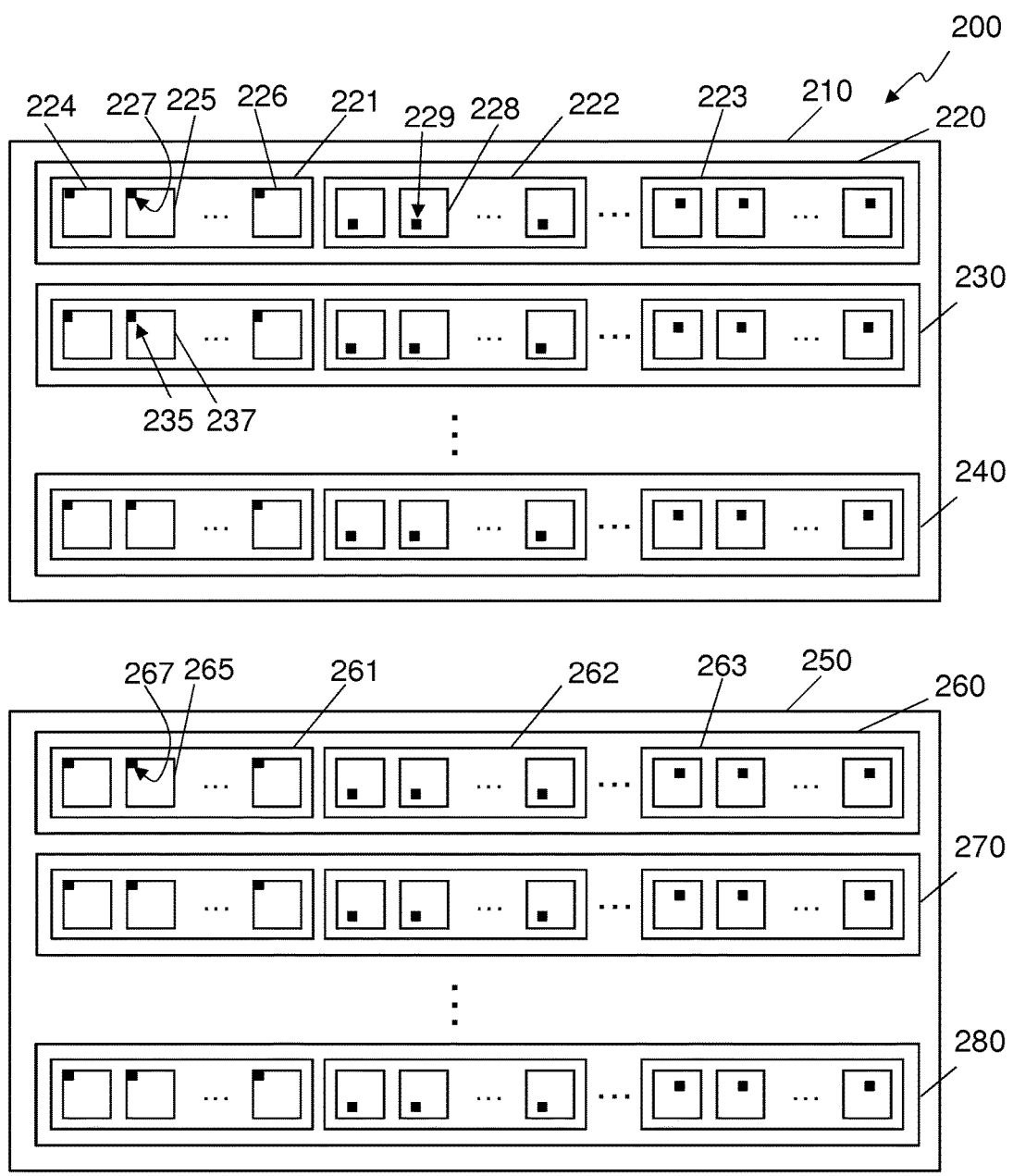
FIG. 2 shows a diagram of an embodiment of distribution of bits of a codeword across an array of memory arrays.

FIG. 2 shows a diagram of an embodiment of distribution of bits of a codeword across an array of memory arrays 200. The array of memory arrays 200 may include any number of memory devices, such as the first memory device 210 and the second memory device 250. The memory devices 210, 250 respectively include arrays of memory arrays that may be grouped in various ways. In the embodiment shown, the first memory device 210 includes multiple partitions such as the first partition 220, the second partition 230, and the third partition 240. The second memory device 250 also includes multiple partitions such as the first partition 260, the second partition 270, and the third partition 280.

The various partitions may be distributed into groups of memory arrays so that a partition is a group of groups of memory arrays. The first partition 220 of the first memory device 210 includes a first group 221, a second group 222, and a third group 223. Likewise, the first partition 260 of the second memory device 250 includes a first group 261, a second group 262, and a third group 263. A group of memory arrays, such as the first group 221 of the first partition 220 of the first memory device 210 may include one or more memory arrays, such as the first memory array 224, the second memory array 225 and the third memory array 226. Embodiments may include any number of partitions in a memory device, with a partition including any number of groups, and a group including any number of memory arrays, or tiles, of memory. Other embodiments may use other organizations of the memory arrays having greater or fewer levels of hierarchy in the organization.

In the embodiment shown, the small black squares indicate bits of data that are assigned to a single codeword, such as data bit 227 in memory array 225 of the first group 221 of the first partition 220 of the first memory device 210, data bit 229 in memory array 228 of the second group 222 of the first partition 220 of the first memory device 210, data bit 235 in memory array 237 of the first group of the second partition 230 of the first memory device 210, and data bit 267 in memory array 265 of the first group 261 of the first partition 260 of the second memory device 250. While all the memory arrays shown include a data bit of the codeword, other memory arrays that may be in groups that are shown or not shown, in partitions that are shown or not shown, in memory devices that are shown or not shown may be included in the array of memory arrays 200 and may or may not include any data of the codeword illustrated.

For a single access, a physical address may identify two or more arrays, such as the memory arrays that include a black square. A logical array address may identify a logical location in the two or more arrays identified by the physical address. In the embodiment shown, the logical array address is transformed based on the logical group number within a partition, without regard for which partition or which chip the group of memory arrays is in. As can be seen from the location of the black square within the memory arrays, the array address for the various memory arrays within a group is the same. So the location of the black squares in memory array 224 and memory array 226 is the same as the location of the black square 227 in the memory array 225, because those three memory arrays are in the first group 221 of the first partition 220 of the first memory device 220.

The location of the black square, which represents a data bit of the codeword, for other memory arrays in the first group of any partition in any memory device of the embodiment shown is in the same location. So the physical location of the data bit 235 of memory array 237 of the first group of the second partition 230 of the first memory device 210, and the physical location of the data bit 267 of the memory array 265 of the first group 261 of the first partition 260 of the second memory device 260 is the same as the physical location of the data bit 227 of memory array 225 of the first group 221 of the first partition 220 of the first memory device 210. But the location of the data bit 229 of the memory array 228 in the second group 222 of the first partition 220 of the first memory device is different.

Figure 3:
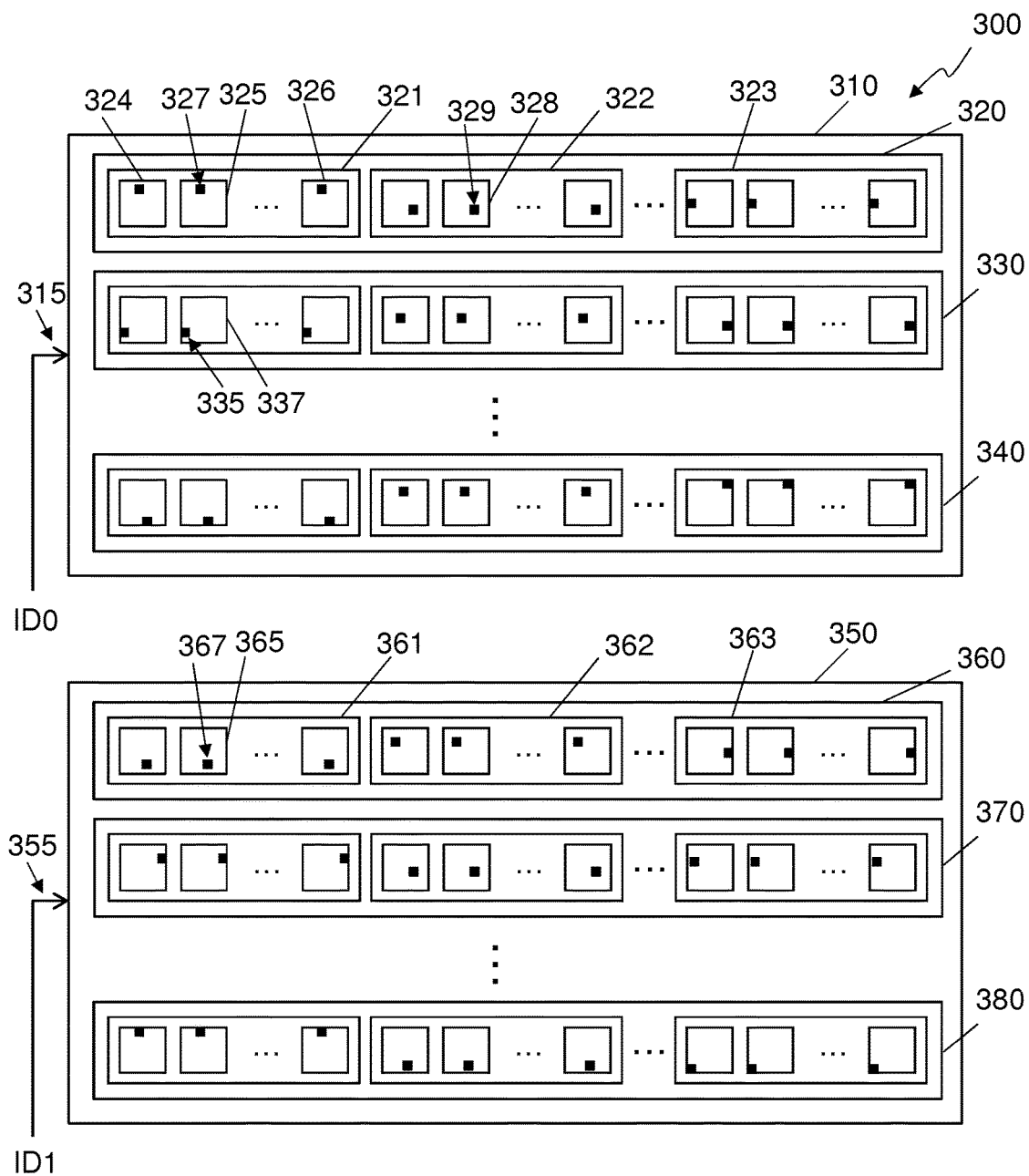
FIG. 3 shows a diagram of an alternative embodiment of distribution of bits of a codeword across an array of memory arrays.

FIG. 3 shows a diagram of an alternative embodiment of distribution of bits of a codeword across an array of memory arrays 300. The array of memory arrays 300 may include any number of memory devices, such as the first memory device 310 coupled to a chip identifier ID0 315, and the second memory device 350 coupled to a different chip identifier ID1 355. The memory devices 310, 320 include an array of memory arrays that may be grouped similarly to the memory devices of FIG. 2. In the embodiment shown, the first memory device 310 includes multiple partitions such as the first partition 320, the second partition 330, and the third partition 340. The second memory device 350 also includes multiple partitions such as the first partition 360, the second partition 370, and the third partition 380. The various partitions may be distributed into groups of memory arrays so that a partition is a group of groups of memory arrays. The first partition 320 of the first memory device 310 includes a first group 321, a second group 322, and a third group 323. Likewise, the first partition 360 of the second memory device 350 includes a first group 361, a second group 362, and a third group 363.

In the embodiment shown, the logical array address is transformed based on the logical group number within a partition, the partition number with a device, and the chip identifier of the device. As can be seen from the location of the black square within the memory arrays, the array address for the various memory arrays within a group is the same, but that location is different for each group shown. So the physical location of the data word within a codeword, as represented by the black squares in memory array 324 and memory array 326 is the same as the location of the black square 327 in the memory array 325, because those three memory arrays are in the first group 321 of the first partition 320 of the first memory device 320.

But the location of data word 329 in the memory array 328 of the first partition 320 of the first memory device 310 is different than the location of the data word 327 in the memory array 325 even though they are in the same partition 320 of the same memory device 310. Similarly, the location of data word 335 in the memory array 337 of the second partition 330 of the first memory device 310 is different than the location of the data word 327 in the memory array 325 even though they are in the same group number of the same memory device 310, and the location of data word 367 in the memory array 365 of the first partition 360 of the second memory device 350 is different than the location of the data word 327 in the memory array 325 even though they are in the same group number of the same partition number because they are in different memory devices.

Figure 4:
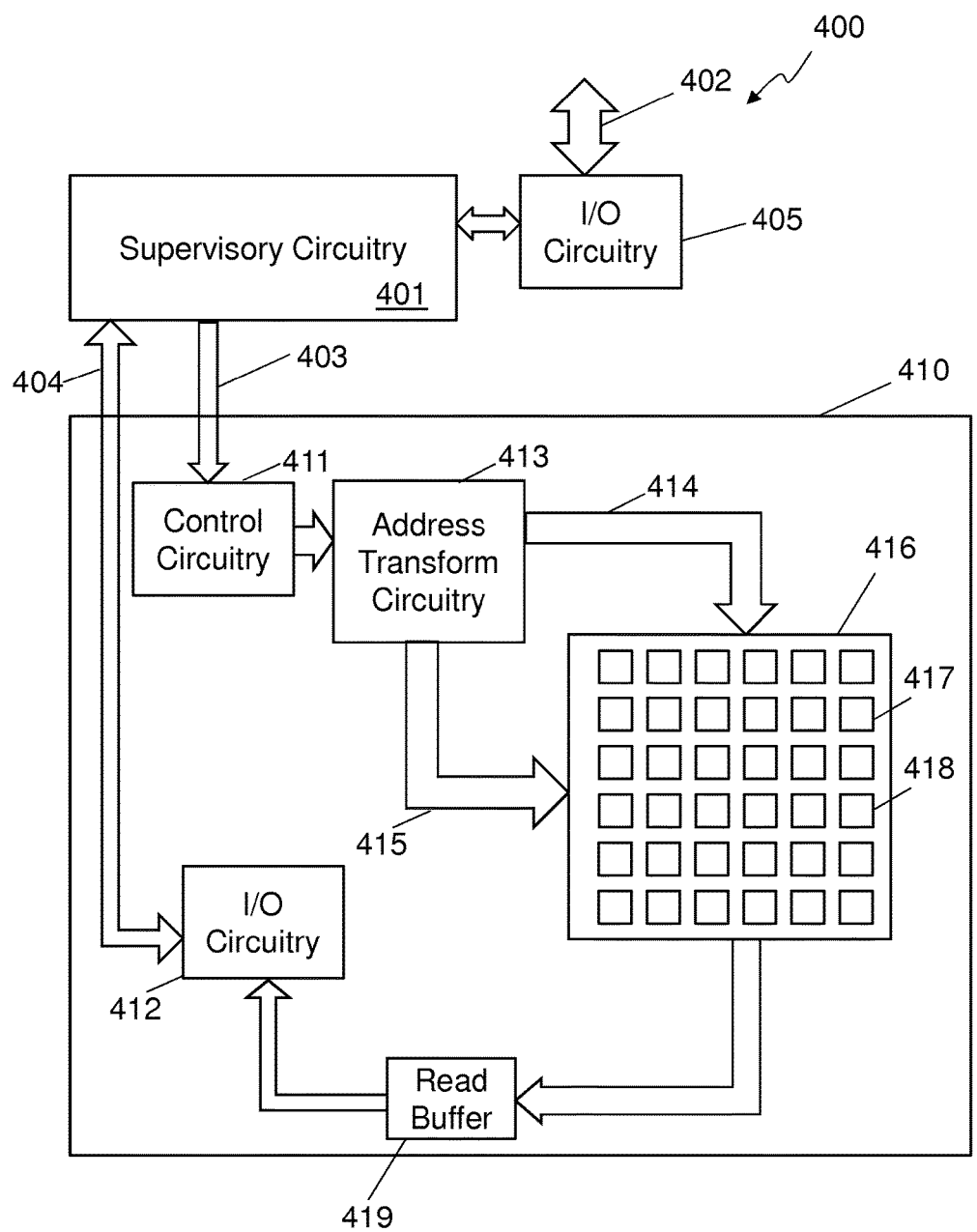
FIG. 4 is a block diagram of an embodiment of an electronic system organized to reduce uncorrectable errors in a memory.

FIG. 4 is a block diagram of an embodiment of an electronic system 400 organized to reduce uncorrectable errors in a memory. Supervisory circuitry 401 is coupled to the memory device 410 with control/address lines 403 and data lines 404. In some embodiments, data and control may utilize the same lines. The supervisory circuitry 401 may include a processor, microprocessor, microcontroller, finite state machine, or some other type of controlling circuitry. The supervisory circuitry 401 may execute instructions of a program in some embodiments. In some embodiments, the supervisory circuitry 401 may be integrated in the same package or even on the same die as the memory device 410. In some embodiments, the supervisory circuitry 401 may be integrated with the control circuitry 411, allowing some of the same circuitry to be used for both functions. The supervisory circuitry 401 may have external memory, such as random access memory (RAM) and read only memory (ROM), used for program storage and intermediate data or it may have internal RAM or ROM. In some embodiments, the supervisory circuitry 401 may use the memory device 410 for program or data storage. A program running on the supervisory circuitry 401 may implement many different functions including, but not limited to, an operating system, a file system, memory block remapping, and error correction.

In some embodiments an external connection 402 is provided. The external connection 402 is coupled to input/output (I/O) circuitry 405 which may then be coupled to the supervisory circuitry 401 and allows the supervisory circuitry 401 to communicate to external devices. In some embodiments, the I/O circuitry 405 may be integrated with the supervisory circuitry 401 so that the external connection 402 is directly coupled to the supervisory circuitry 401. If the electronic system 400 is a storage system, the external connection 402 may be used to provide an external device with non-volatile storage. The electronic system 400 may be a solid-state drive (SSD), a USB thumb drive, a secure digital card (SD Card), or any other type of storage system. The external connection 402 may be used to connect to a computer or other intelligent device such as a cell phone or digital camera using a standard or proprietary communication protocol. Examples of computer communication protocols that the external connection 402 may be compatible with include, but are not limited to, any version of the following protocols: Universal Serial Bus (USB), Serial Advanced Technology Attachment (SATA), Small Computer System Interconnect (SCSI), Fibre Channel, Parallel Advanced Technology Attachment (PATA), Integrated Drive Electronics (IDE), Ethernet, IEEE-1394, Secure Digital Card interface (SD Card), Compact Flash interface, Memory Stick interface, Peripheral Component Interconnect (PCI) or PCI Express (PCI-e).

If the electronic system 400 is a computing system, such as a mobile telephone, a tablet, a notebook computer, a set-top box, or some other type of computing system, the external connection 402 may be a network connection such as, but not limited to, any version of the following protocols: Institute of Electrical and Electronic Engineers (IEEE) 802.3, IEEE 802.11, Data Over Cable Service Interface Specification (DOCSIS), digital television standards such as Digital Video Broadcasting (DVB)—Terrestrial, DVB-Cable, and Advanced Television Committee Standard (ATSC), and mobile telephone communication protocols such as Global System for Mobile Communication (GSM), protocols based on code division multiple access (CDMA) such as CDMA2000, and Long Term Evolution (LTE).

The memory device 410 may include an array 416 of memory arrays 417, 418. Address lines and control lines 403 may be received and decoded by control circuitry 411. I/O circuitry 412 may couple to the data lines 404 allowing data to be received from and sent to the supervisory circuitry 401. Data read from the memory array 416 may be temporarily stored in read buffers 419. Address transform circuitry 413 may generate a first array address 414 that may be coupled to one or more memory arrays 417 and a second array address 415 that may be coupled to one or more memory arrays 418. The address transform circuitry 413 may transform a logical array address that may be received from the supervisory circuitry on at least a portion of the address lines 403 to the at least two array unique array addresses 414, 415 based, at least in part, on logical locations of the memory arrays 417, 418 within the set of memory arrays.

Data stored in the array of memory arrays 416 may be arranged into codewords that include error correction codes. Once a codeword has been read from the array of memory arrays 416, one or more errors may be corrected in the data of the codeword. In some embodiments, the error correction may be performed within the memory device 410. In other embodiments, the supervisory circuitry 401 may read the data of a codeword from the memory device 410 using one or more memory access commands, and then the supervisory circuitry 401 may correct one or more errors in the data of the codeword.

The system illustrated in FIG. 4 has been simplified to facilitate a basic understanding of the features of the memory. Many different embodiments are possible including using a solid state drive controller as the supervisory circuitry 401 and I/O circuitry 405 to control a plurality of memory devices 410 to act as a solid state drive. Another embodiment may use a processor for the supervisory circuitry 401 and I/O circuitry 405 with additional functions, such as a video graphics controller driving a display, and other devices for human oriented I/O may be utilized to implement a personal computer, personal computer or smart phone.

Figures 5, 6:
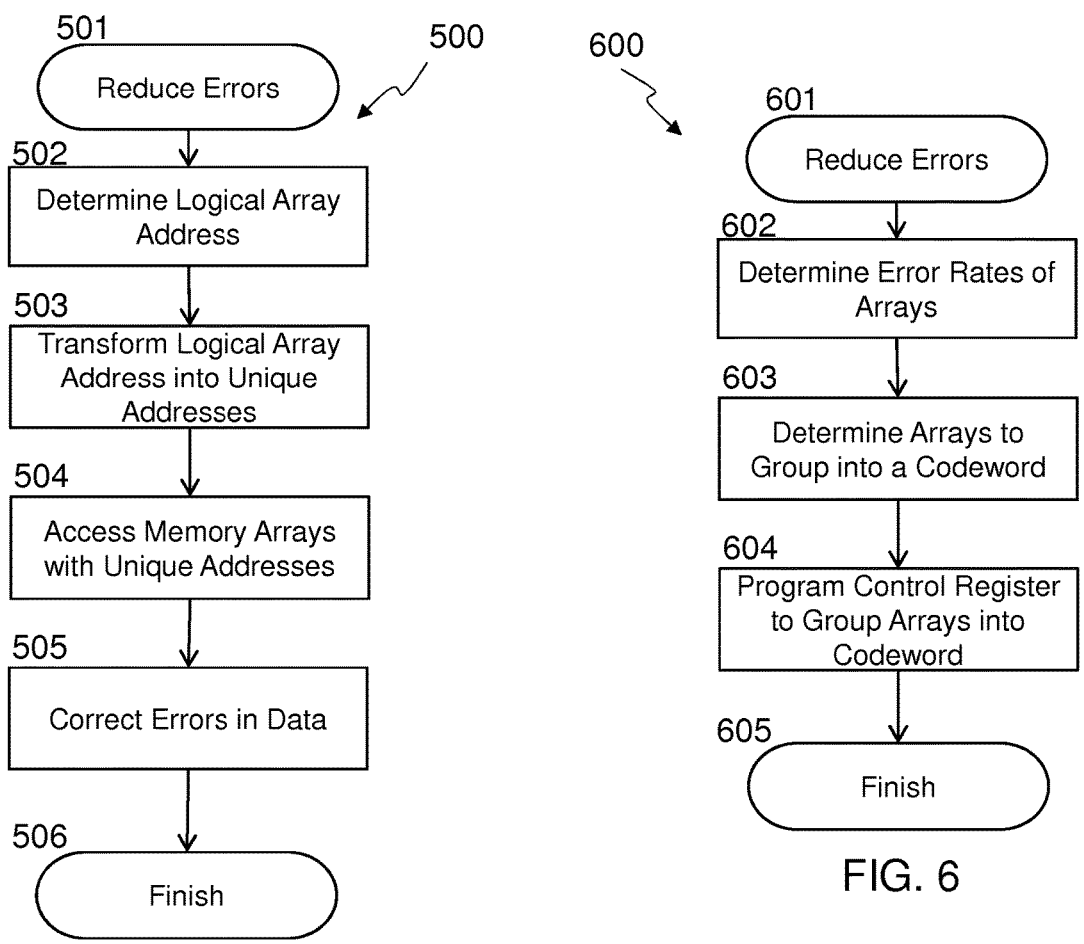
FIG. 5 is a flowchart of an embodiment of a method to reduce uncorrectable errors in a memory.
FIG. 6 is a flowchart of an alternate embodiment of a method to reduce uncorrectable errors in a memory.

FIG. 5 is a flowchart 500 of an embodiment of a method to reduce uncorrectable errors in a memory. The method starts at block 501 and determines a logical array address at block 502. The logical array address in some embodiments may be a portion of an address that is sent from a processor or supervisory circuitry that may be coupled to a memory device. The logical array address may be transformed at block 503 into at least two unique array addresses based, at least in part, on logical locations of at least two memory arrays within the set of memory arrays. The transforming may be performed by re-ordering address lines in some embodiments. In other embodiments, the transforming may be performed by one or more arithmetic operations using the logical array address. In some embodiments, the transforming may also be based on values programmed into a control register.

The unique array addresses may include row addresses and column addresses. An array address is unique if its combined row address and column address is different from other array addresses. So two array addresses are unique if the first row address is different than the second row address, or the first column address is different than the second column address.

The array addresses may be used to access memory arrays at block 504. One array address may be coupled to a group of memory arrays of the set of memory arrays. A location of the group of memory arrays within the set of memory arrays may be used as a logical location for the transforming of the logical array address. In some embodiments, a chip identifier, which may differentiate between multiple chips of a system, may be used as a part of the logical location. Data from the two or more memory arrays may be read to determine a word of data that includes error correction codes and at least one error in the word of data may be corrected at block 505 before the flowchart 500 completes at block 506.

FIG. 6 is a flowchart 600 of an alternate embodiment of a method to reduce uncorrectable errors in a memory. The flowchart 600 begins at block 601 and continues at block 602 by determining error rates of two or more memory arrays in a memory device. In some embodiments, the determining of error rates of the two or more memory arrays may be done as a part of a manufacturing test process on a stand-alone memory device before it is integrated into a system. The manufacturing test may be performed on the memory die before packaging or after it is integrated into a package. In some embodiments, multiple memory die may be integrated into a single package with a chip identifier input identifying a logical position of the die in the package. In other embodiments, the determining of the error rates of the two or more memory arrays may be performed in a system environment after the memory device is integrated into a system such as into a computer, a tablet, a smart phone, or some other type of electronic system. The memory arrays may be tested to determine their error rates in a system test environment, or during normal operation, and the testing may occur at the time that the system is manufactured, or even after the system is deployed. In some embodiments, the error rates may be based on data collected during normal operation of the system, and made available to help determine how to map the two or more memory arrays into two or more codewords.

Once the error rates of the two or more memory arrays have been obtained, a mapping of the two or more memory arrays into two or more codewords may be determined 603 based on the error rates. Memory arrays having higher error rates than other memory arrays may be distributed among different codewords to distribute the errors so that they are more likely to be correctable. Likewise, memory arrays having lower error rates than other memory arrays may be distributed. By distributing the likely errors among codewords, the number of errors that are likely to occur in a single codeword may be reduced, which may reduce the number of uncorrectable errors.

Once a desired mapping has been determined, a control register may be programmed 604 to map the two or more memory arrays into the two or more codewords. The control register may use any type of storage technology, but may utilize non-volatile one-time programmable elements in at least one embodiment. The programming may be performed at any time, such as a part of a manufacturing test process or in a system environment, depending on the embodiment. In operation, the memory device may respond to one or more memory accesses to allow a codeword of data to be retrieved from the memory device. Then at least one error may be corrected in the codeword of data. The flowchart completes at block 605.

Figure 7A:
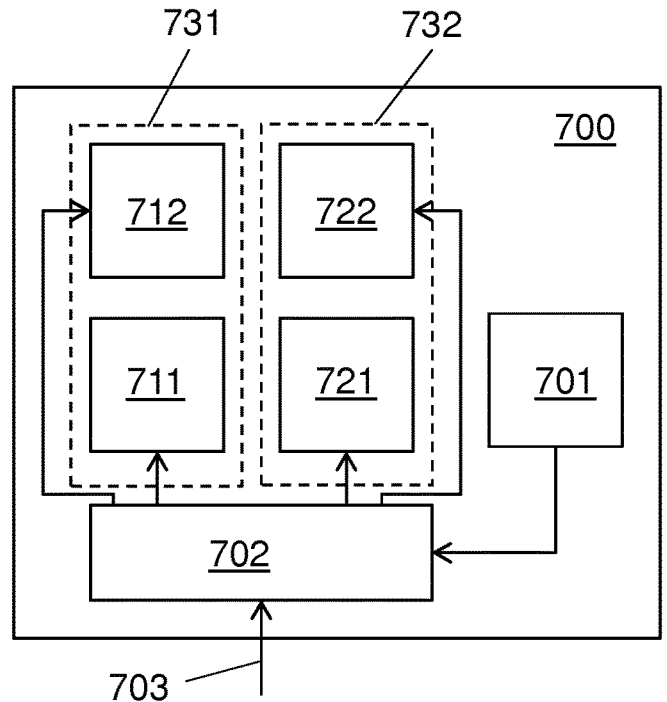
FIGS. 7A and 7B are block diagrams of an embodiment of a memory organized to reduce uncorrectable errors in a memory.
Figure 7B:
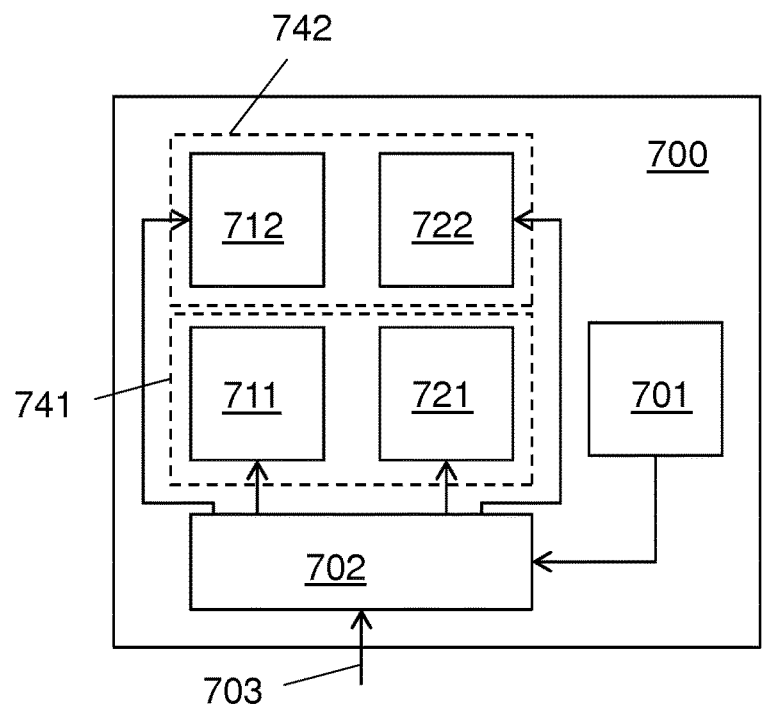

FIGS. 7A and 7B are block diagrams of an embodiment of a memory 700 organized to reduce uncorrectable errors in a memory. The memory 700 may be suitable for use with the method shown in FIG. 6. The memory 700 includes control registers 701 and address transform circuitry 702 that receives an address 703 and uses data programmed into the control registers 701 to selectively enable the memory arrays 711, 712, 721, 722. The memory arrays may be grouped into groups of memory arrays where data from a group of memory arrays is used in a codeword for error correction. As described in flowchart 600, the memory arrays may be tested to determine their error rates. Once the error rates are determined, the control register may be programmed to distribute the memory arrays with higher error rates among different codewords.

In FIG. 7A, the memory arrays may be tested and it may be determined that memory array 711 has the lowest error rate, memory array 722 has the second lowest error rate, memory array 721 has the second highest error rate, and memory array 712 has the highest error rate. Once the error rates have been determined, it may be determined that grouping memory array 711 and memory array 712 into a first group 731, and memory array 721 and memory array 722 into a second group 732 may provide for reduced uncorrectable memory errors. Control register 701 may then be programmed with information to control the address transform circuitry 702 to perform that mapping. So a first memory array 712 having a higher error rate than other memory arrays of the two or more memory arrays may be mapped to a particular codeword and a second memory array 711 having a lower error rate than other memory arrays of the two or more memory arrays may be mapped to the same particular codeword.

In FIG. 7B, the memory arrays may be tested and it may be determined that memory array 712 has the lowest error rate, memory array 711 has the second lowest error rate, memory array 721 has the second highest error rate, and memory array 722 has the highest error rate. Once the error rates have been determined, it may be determined that grouping memory array 711 and memory array 721 into a first group 741, and memory array 712 and memory array 722 into a second group 742 may provide for reduced uncorrectable memory errors. Control register 701 may then be programmed with information to control the address transform circuitry 702 to perform that mapping.

The flowchart and/or block diagrams in the figures help to illustrate the operation of possible implementations of methods of various embodiments. It should be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

Examples of various embodiments are described in the following paragraphs:

An example method to reduce uncorrectable memory errors may include determining a logical array address for a set of memory arrays, transforming the logical array address to at least two unique array addresses based, at least in part, on logical locations of at least two memory arrays within the set of memory arrays, and accessing the at least two memory arrays using the at least two unique array addresses, respectively. The transforming reduces uncorrectable errors in error correction codewords that include data from the set of memory arrays. In some example methods an error correction codeword includes at least a bit of data, respectively, from memory arrays of the set of memory arrays, and a common physical location in the at least two memory arrays is mapped to at least two different error correction codewords to reduce uncorrectable memory errors due to systemic errors in the set of memory arrays overloading the error correction codeword with errors. Some example methods may also include retrieving data of an error correction codeword from the set of memory arrays using the at least two unique array addresses, and providing the data of the error correction codeword from the set of memory arrays to a controller, wherein the controller corrects one or more errors in the error correction codeword. In some example methods the transforming includes re-ordering address lines of the logical array address. In some example methods the transforming includes performing an arithmetic operation on the logical array address. In some example methods the transforming is also based, in part, on values programmed into a control register. In some example methods a first unique array address includes a first row address and a first column address, and a second unique array address includes a second row address and a second column address, wherein the first row address is different than the second row address, or the first column address is different than the second column address. Some example methods may also include accessing a group of memory arrays within the set of memory arrays using a first unique array address of the at least two unique array addresses. In some example methods the logical locations of the at least two memory arrays include identifiers of groups of memory arrays within the set of memory arrays. In some example methods the logical locations of the at least two memory arrays further include chip identifiers. Any combination of the examples of this paragraph may be used in embodiments.

An example integrated circuit includes means for determining a logical array address for a set of memory arrays, means for transforming the logical array address to at least two unique array addresses based, at least in part, on logical locations of at least two memory arrays within the set of memory arrays, and means accessing the at least two memory arrays using the at least two unique array addresses, respectively, wherein the transforming of the logical array address reduces uncorrectable errors in error correction codewords including data from the set of memory arrays. In some example integrated circuits an error correction codeword includes at least a bit of data, respectively, from memory arrays of the set of memory arrays, and a common physical location in the at least two memory arrays is mapped to at least two different error correction codewords to reduce uncorrectable memory errors due to systemic errors in the set of memory arrays overloading the error correction codeword with errors. Some example integrated circuits also include means for retrieving data of an error correction codeword from the set of memory arrays using the at least two unique array addresses, and means for providing the data of the error correction codeword from the set of memory arrays to a controller, wherein the controller is configured to correct one or more errors in the error correction codeword. In some example integrated circuits said means for transforming includes means for re-ordering address lines of the logical array address. In some example integrated circuits said means for transforming includes means for performing an arithmetic operation on the logical array address. In some example integrated circuits a first unique array address includes a first row address and a first column address, and a second unique array address includes a second row address and a second column address, wherein the first row address is different than the second row address, or the first column address is different than the second column address. Some example integrated circuits also include means for accessing a group of memory arrays within the set of memory arrays using a first unique array address of the at least two unique array addresses. In some example integrated circuits the logical locations of the at least two memory arrays include identifiers of groups of memory arrays within the set of memory arrays. Any combination of the examples of this paragraph may be used in embodiments.

An example integrated circuit includes a set of memory arrays including at least a first memory array and a second memory array, a first circuit to transform a logical array address into a first unique array address coupled to the first memory array based, at least in part, on a logical location of the first memory array within the set of memory arrays, and a second circuit to transform the logical array address into a second unique array address coupled to the second memory array based, at least in part, on a logical location of the second memory array within the set of memory arrays. In the example integrated circuit, data from the first memory array at the first unique array address and data from the second memory array at the second unique array address are included in a particular error correction codeword to reduce uncorrectable errors in the particular error correction codeword. In some example integrated circuits a first error correction codeword includes data identified by a first logical array address, and a second error correction codeword includes data identified by a second logical array address, the first circuit transforms a first logical address to identify a particular array location in the first memory array and the second circuit transforms a second logical address to identify the particular array location in the second memory array, and a systemic error in the particular array location in both the first memory array and the second memory array distributes errors between the first error correction codeword and the second error correction codeword to avoid overloading either the first error correction codeword or the second error correction codeword with errors. Some example integrated circuits may also include a data interface to provide data of the particular error correction codeword to a controller, wherein the controller is configured to correct one or more errors in the particular error correction codeword. In some example integrated circuits the first circuit includes circuitry to re-order address lines of the logical array address. In some example integrated circuits the first circuit includes circuitry to perform an arithmetic operation using the logical array address and at least a portion of the logical location of the first memory array within the set of memory arrays. In some example integrated circuits the second circuit includes circuitry to perform the arithmetic operation using the logical array address and at least a portion of the logical location of the second memory array within the set of memory arrays. In some example integrated circuits the first circuit includes circuitry to transform the logical array address based, in part, on values programmed into a control register. In some example integrated circuits the logical locations of the at least two memory arrays include identifiers of groups of memory arrays within the set of memory arrays. Some example integrated circuits also include a chip identifier input, wherein the logical locations of the at least two memory arrays further include values received from the chip identifier input. Any combination of the examples of this paragraph may be used in embodiments.

An example electronic system includes supervisory circuitry to generate memory read commands including a logical array address, and a memory, coupled to the supervisory circuitry, to respond to the memory control commands. The memory in the example electronic system may include a set of memory arrays, circuitry to transform the logical array address to at least two unique array addresses based, at least in part, on logical locations of at least two memory arrays within the set of memory arrays, the at least two unique array addresses coupled to the at least two memory arrays, respectively, and circuitry to provide data identified by the at least two unique array addresses from the at least two memory arrays to the supervisory circuitry in response to the memory control commands. In the example electronic system the data identified by the logical array address is included in a particular error correction codeword to reduce uncorrectable errors the particular error correction codeword, and the supervisory circuitry is configured to correct errors in data of error correction codewords, including the particular error correction codeword. In some example electronic systems at least two error correction codewords include data identified respectively by at least two different logical array addresses, the circuit transforms the at least two different logical array addresses to respectively address a common array location in the at least two memory arrays, and a systemic error in the common array location in the at least two memory arrays distributes errors among the least two error correction codewords to avoid overloading any one of the least two error correction codewords with errors. In some example electronic systems the circuitry to transform the logical array address includes circuitry to re-order address lines of the logical array address to create the at least two unique array addresses. In some example electronic systems the circuitry to transform the logical array address includes circuitry to perform an arithmetic operation using the logical array address and at least a portion of a logical location of a first memory array within the set of memory arrays to create a first unique array address to couple to the first memory array, and circuitry to perform an arithmetic operation using the logical array address and at least a portion of a logical location of a second memory array within the set of memory arrays to create a second unique array address to couple to the second memory array. In some example electronic systems the circuitry includes circuitry to transform the logical array address based, in part, on values programmed into a control register. In some example electronic systems the logical locations of the at least two memory arrays include identifiers of groups of memory arrays within the set of memory arrays. In some example electronic systems the memory is a first memory and the electronic system may also include a first chip identifier coupled to the first memory, a second memory coupled to the supervisory circuitry, and a second chip identifier coupled to the second memory. In some example electronic systems the second memory includes a first memory array and a second memory array, a first circuit to transform the logical array address into row and column addresses for the first memory array and the second memory array based, at least in part, on the second chip identifier, and a second circuit to provide additional data from the first memory array and the second memory array to the supervisory circuitry in response to the memory control commands. In some example electronic systems the circuitry of the first memory transforms the logical array address to the at least two unique array addresses based, at least in part, on the first chip identifier, and the supervisory circuitry is configured to correct at least one error in a codeword including the data from the first memory and the additional data from the second memory. Some example electronic system may also include I/O circuitry, coupled to the supervisory circuitry, to communicate with an external device. At least one example electronic systems is a solid state drive. Any combination of the examples of this paragraph may be used in embodiments.

An example method to reduce uncorrectable memory errors may include obtaining error rates of two or more memory arrays in a memory device, determining a mapping of the two or more memory arrays into two or more codewords based on said error rates, and programming a control register to map the two or more memory arrays into the two or more codewords, wherein said mapping reduces uncorrectable errors in the two or more codewords. In some example methods, values programmed into the control register configure the memory device to map a first memory array having a higher error rate than other memory arrays of the two or more memory arrays to a particular codeword, and map a second memory array having a lower error rate than other memory arrays of the two or more memory arrays to the particular codeword. In some example methods the determining and the programming are performed as a part of a manufacturing test process on the memory device. In some example methods the determining and the programming are performed in a system environment. Some example methods may also include retrieving a codeword of data from the memory device, and correcting at least one error in the codeword of data. Any combination of the examples of this paragraph may be used in embodiments.

An example electronic system includes means for obtaining error rates of two or more memory arrays in a memory device, means for determining a mapping of the two or more memory arrays into two or more codewords based on said error rates to reduce uncorrectable errors in the two or more codewords, and means for programming a control register to map the two or more memory arrays into the two or more codewords. Some example electronic systems may also include means for programming values into the control register to configure the memory device to map a first memory array having a higher error rate than other memory arrays of the two or more memory arrays to a particular codeword, and map a second memory array having a lower error rate than other memory arrays of the two or more memory arrays to the particular codeword. Some example electronic systems may also include means for retrieving a codeword of data from the memory device, and means for correcting at least one error in the codeword of data. Any combination of the examples of this paragraph may be used in embodiments.

As used in this specification and the appended claims, the singular forms "a", "an", and "the" include plural referents unless the content clearly dictates otherwise. Furthermore, as used in this specification and the appended claims, the term "or" is generally employed in its sense including "and/or" unless the content clearly dictates otherwise. As used herein, the term "coupled" includes direct and indirect connections. Moreover, where first and second devices are coupled, intervening devices including active devices may be located there between.

The description of the various embodiments provided above is illustrative in nature and is not intended to limit this disclosure, its application, or uses. Thus, different variations beyond those described herein are intended to be within the scope of embodiments. Such variations are not to be regarded as a departure from the intended scope of this disclosure. As such, the breadth and scope of the present disclosure should not be limited by the above-described exemplary embodiments, but should be defined only in accordance with the following claims and equivalents thereof.

What is claimed is:

1. A method to reduce uncorrectable memory errors comprising:
   determining a logical array address for a set of memory arrays;
   transforming the logical array address to at least two unique array addresses based, at least in part, on a logical location of at least two memory arrays within the set of memory arrays, transforming the logical array address includes at least one of:
      rotating the logical array address by a number of locations based on the logical location;
      rotating upper lines of the logical array address by a first multiple and rotating lower lines of the logical array address by a second multiple, different than the first multiple; or
      adding a multiple of the logical location to the logical array address and discarding any additional upper bits; and
   accessing the at least two memory arrays using the at least two unique array addresses, respectively;
   wherein transforming to the at least two unique array addresses causes a reduction to uncorrectable errors for data included in an error correction codeword stored in the set of memory arrays.

2. The method of claim 1, the error correction codeword comprises at least a bit of data, respectively, stored in memory arrays of the set of memory arrays; and
   a common physical location in the at least two memory arrays is mapped to at least two different error correction codewords to reduce uncorrectable memory errors due to systemic errors in the set of memory arrays overloading the error correction codeword with errors.

3. The method of claim 1, further comprising:
   retrieving the error correction codeword stored in the set of memory arrays using the at least two unique array addresses; and
   providing the error correction codeword to a controller the controller to correct one or more errors in the data included in the error correction codeword.

4. The method of claim 1, a first unique array address comprises a first row address and a first column address; and
   a second unique array address comprises a second row address and a second column address, the first row address is different than the second row address, or the first column address is different than the second column address.

5. The method of claim 1, further comprising accessing a group of memory arrays within the set of memory arrays using a first unique array address of the at least two unique array addresses.

6. The method of claim 1, the logical locations of the at least two memory arrays comprise identifiers of groups of memory arrays within the set of memory arrays.

7. The method of claim 6, the logical locations of the at least two memory arrays further comprise chip identifiers.

8. The method of claim 1, the set of memory arrays comprises a first memory array located on a first memory die and a second memory array located on a second memory die.

9. An integrated circuit comprising:
   a set of memory arrays comprising at least a first memory array and a second memory array;
   a first circuit to transform a logical array address into a first unique array address coupled to the first memory array based, at least in part, on a logical location of the first memory array within the set of memory arrays; and
   a second circuit to transform the logical array address into a second unique array address coupled to the second memory array based, at least in part, on a logical location of the second memory array within the set of memory arrays, the second circuit is to perform operations that includes at least one of:
      a rotation of the logical array address by a number of locations based on the logical location;
      a rotation of upper lines of the logical array address by a first multiple and rotating lower lines of the logical array address by a second multiple, different than the first multiple; or
      add a multiple of the logical location to the logical array address and discard any additional upper bits;
   wherein data from the first memory array at the first unique array address and data from the second memory array at the second unique array address are included in a particular error correction codeword to reduce uncorrectable errors in data included the particular error correction codeword.

10. The integrated circuit of claim 9, comprising:
    a first error correction codeword that includes data identified by a first logical array address, and a second error correction codeword that includes data identified by a second logical array address;
    the first circuit transforms a first logical address to identify a particular array location in the first memory array and the second circuit transforms a second logical address to identify the particular array location in the second memory array; and a systemic error in the particular array location in both the first memory array and the second memory array distributes errors between the first error correction codeword and the second error correction codeword to avoid overloading either the first error correction codeword or the second error correction codeword with errors.

11. The integrated circuit of claim 9, further comprising:
a data interface to provide the particular error correction codeword to a controller;
wherein the controller is configured to correct one or more errors in the data included in particular error correction codeword.

12. The integrated circuit of claim 9, the first circuit comprises circuitry to re-order address lines of the logical array address.

13. The integrated circuit of claim 9, the first circuit comprises circuitry to perform an arithmetic operation via use of the logical array address and at least a portion of the logical location of the first memory array within the set of memory arrays.

14. The integrated circuit of claim 13, the second circuit comprises circuitry to perform the arithmetic operation via use of the logical array address and at least a portion of the logical location of the second memory array within the set of memory arrays.

15. The integrated circuit of claim 9, the first circuit comprises circuitry to transform the logical array address based, in part, on values programmed into a control register.

16. The integrated circuit of claim 9, the logical locations of the at least two memory arrays comprise identifiers of groups of memory arrays within the set of memory arrays.

17. The integrated circuit of claim 9, further comprising a chip identifier input;
wherein the logical locations of the at least two memory arrays further comprise values received from the chip identifier input.

18. The integrated circuit of claim 9, comprising:
the first memory array located on a first memory die; and
the second memory array located on a second memory die.

19. An electronic system comprising:
supervisory circuitry to generate memory read commands comprising a logical array address; and
a memory, coupled to the supervisory circuitry, to respond to the memory read commands, the memory comprising:
a set of memory arrays;
circuitry to transform the logical array address to at least two unique array addresses based, at least in part, on a logical location of at least two memory arrays within the set of memory arrays, the at least two unique array addresses coupled to the at least two memory arrays, respectively, the circuitry is to perform operations that includes at least one of:
a rotation of the logical array address by a number of locations based on the logical location;
a rotation of upper lines of the logical array address by a first multiple and rotating lower lines of the logical array address by a second multiple, different than the first multiple; or
add a multiple of the logical location to the logical array address and discard any additional upper bits; and circuitry to provide data identified by the at least two unique array addresses stored in the at least two memory arrays to the supervisory circuitry in response to the memory read commands;
wherein the data identified by the logical array address is included in a particular error correction codeword to reduce uncorrectable errors for the data included in the particular error correction codeword; and
the supervisory circuitry is configured to correct errors in data included in error correction codewords, including the data included in the particular error correction codeword.

20. The electronic system of claim 19, wherein the memory is a first memory, the electronic system further comprising:
a first chip identifier coupled to the first memory;
a second memory coupled to the supervisory circuitry; and
a second chip identifier coupled to the second memory;
wherein the second memory comprises:
a first memory array and a second memory array;
a first circuit to transform the logical array address into row and column addresses for the first memory array and the second memory array based, at least in part, on the second chip identifier; and
a second circuit to provide additional data stored in the first memory array and the second memory array to the supervisory circuitry in response to the memory read commands;
wherein the circuitry of the first memory transforms the logical array address to the at least two unique array addresses based, at least in part, on the first chip identifier; and
the supervisory circuitry is configured to correct at least one error in data included in an error correction codeword, the data stored in the first memory and the additional data stored in the second memory.

21. The electronic system of claim 20, comprising:
the first memory located on a first memory die; and
the second memory located on a second memory die.

22. The electronic system of claim 19, further comprising:
I/O circuitry, coupled to the supervisory circuitry, to communicate with an external device.

23. The electronic system of claim 19, the electronic system comprises a solid state drive.

24. A method to reduce uncorrectable memory errors comprising:
obtaining error rates of two or more memory arrays in one or more memory devices;
determining a mapping of the two or more memory arrays into two or more error correction codewords based on the error rates; and
programming a control register to map the two or more memory arrays to store data included in the two or more error correction codewords;
wherein said mapping reduces uncorrectable errors in the two or more error correction codewords.

25. The method of claim 24, values programmed into the control register configure the one or more memory devices to:
map a first memory array having a higher error rate than other memory arrays of the two or more memory arrays to store data included in a first error correction codeword; and map a second memory array having a lower error rate than other memory arrays of the two or more memory arrays to store data included in a second error correction codeword.

26. The method of claim 24, determining the mapping and programming the control register are performed as a part of a manufacturing test process on one or more the memory devices.

27. The method of claim 24, determining the mapping and programming the control register are performed in a system environment.

28. The method of claim 24, further comprising:
retrieving data included in one of the two or more error correction codewords stored in the two or more memory arrays; and
correcting at least one error in the data included in the one of the two or more error correction codewords.

29. The method of claim 24, the two or more memory arrays in the one or more memory devices comprises a first memory array located on a first memory device and a second memory array located on a second memory device.

30. The method of claim 24, the two or more memory arrays in the one or more memory devices comprises a first memory array located on a first memory die and a second memory die.

* * * * *